United States Patent
Horie

(10) Patent No.: US 7,382,814 B2
(45) Date of Patent: Jun. 3, 2008

(54) SEMICONDUCTOR LASER DEVICE AND METHOD OF MANUFACTURING THE SAME

(75) Inventor: Junichi Horie, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 60 days.

(21) Appl. No.: 11/409,239

(22) Filed: Apr. 24, 2006

(65) Prior Publication Data

US 2007/0030869 A1 Feb. 8, 2007

(30) Foreign Application Priority Data

Aug. 8, 2005 (JP) ............................ 2005-229371

(51) Int. Cl.
 *H01S 5/00* (2006.01)
(52) U.S. Cl. ..................... 372/50.12; 372/50.121; 372/50.122; 372/50.123; 372/50.124
(58) Field of Classification Search ............ 372/50.12, 372/50.121, 50.122, 50.123, 50.124
See application file for complete search history.

(56) References Cited

U.S. PATENT DOCUMENTS

2002/0021725 A1* 2/2002 Abe .......................... 372/46
2004/0151223 A1* 8/2004 Yoshida ...................... 372/45
2004/0156408 A1* 8/2004 Tanaka et al. ................ 372/45
2004/0196877 A1* 10/2004 Kawakami et al. .......... 372/23
2005/0271108 A1* 12/2005 Wada et al. .............. 372/50.12

FOREIGN PATENT DOCUMENTS

JP   64-073726   3/1989
JP   2002-261397   9/2002

\* cited by examiner

*Primary Examiner*—Minsun Harvey
*Assistant Examiner*—Tod T Van Roy
(74) *Attorney, Agent, or Firm*—Leydig, Voit & Mayer, Ltd.

(57) ABSTRACT

A semiconductor laser diode comprises: an n-type GaAs substrate; and a first laser diode structure having a first n-type cladding layer, a first active layer including a quantum well layer, a first p-type cladding layer on the first active layer, a p-type signal layer on the first p-type cladding layer and which has the same constituent elements as those of the first p-type cladding layer, and a p-type ridge waveguide in a stripe mesa-like shape on the signal layer, which has the same constituent elements as those of the signal layer, and in which composition ratios of two constituent elements in a complementary relation of constituent elements are different from those composition ratios of the signal layer.

7 Claims, 3 Drawing Sheets

SEMICONDUCTOR LASER DEVICE AND METHOD OF MANUFACTURING THE SAME

BACKGROUND OF THE INVENTION

1. Field of the Invention

The present invention relates to a semiconductor laser device and a method of manufacturing the same, and more particularly to a semiconductor laser device for use in information electronic apparatuses, and a method of manufacturing the same.

2. Description of the Related Art

In recent years, a DVD device has increased in demand as one of high-speed and large-capacity storage devices. The DVD device includes therein a DVD-R/RW device and a CD-R/RW device in a hybrid form. Therefore, the DVD device uses two kinds of semiconductor lasers, i.e., a semiconductor laser (a laser diode having an emission wavelength of about 650 nm (hereinafter, the laser diode is referred to as "an LD") for the DVD device, and a semiconductor laser (an LD having an emission wavelength of about 780 nm) for the CD device.

A monolithic two-wavelength semiconductor diode (hereinafter referred to as a monolithic two-wavelength LD) has been developed. In the monolithic two-wavelength LD, such two semiconductor lasers for emitting laser beams having two wavelengths are not formed by forming a plurality of single semiconductor lasers for emitting laser beams having respective specific wavelengths to assemble them, but mounted on the same substrate on one chip. Thus, the alignment for the emission point positions of the semiconductor lasers for emitting laser beams having different emission wavelengths can be precisely performed. Also, it is possible to reduce the number of components or parts of an optical system.

A method of manufacturing the monolithic two-wavelength LD will hereinafter be schematically described.

Firstly, an n-type AlGaInP cladding layer (hereinafter "n-type", "p-type", and a conductivity type free from the added impurity are represented by "n-", "p-", and "i-", respectively), a multiple quantum well (hereinafter referred to as "an MQW") active layer including a barrier layer and a well layer, are epitaxially grown on an n-GaAs substrate by using the MOCVD method or MBF method. Then, a first p-AlGaInP cladding layer, a first etching stop layer (hereinafter "an etching stop layers" is referred to as "an ESL layer") made of $Ga_{0.58}In_{0.42}P$ for example, and a second p-AlGaInP cladding layer are successively laminated on the MQW active layer through the epitaxial growth by using the MOCVD method or MBF method. Thereafter, a stripe-like resist pattern is formed so as to cover the second p-AlGaInP cladding layer. Then, the n-AlGaInP cladding layer, the MQW active layer, the first p-AlGaInP cladding layer, the first ESL layer, and the second p-AlGaInP cladding layer are selectively etched away until the n-GaAs substrate is exposed with the stripe-like resist pattern used as an etching mask. As a result, the n-AlGaInP cladding layer, the MQW active layer, the first p-AlGaInP cladding layer, the first ESL layer, and the second p-AlGaInP cladding layer are left in the form of a first mesa-like lamination structure. The first mesa-like lamination structure forms a semiconductor laser for a CD device.

Next, the resist pattern left on the surface of the first mesa-like lamination structure is removed. Thus, an n-AlGaInP cladding layer, an MQW active layer, a first p-AlGaInP cladding layer, a second ESL layer made of $(Al_{0.5}Ga_{0.5})_{0.51}In_{0.49}P$, and a second p-AlGaInP cladding layer are successively formed on the GaAs substrate including the first mesa-like lamination structure. Thereafter, a stripe-like resist pattern is formed so as to cover the second p-AlGaInP cladding layer adjacent to the first mesa-like lamination structure. Then, the n-AlGaInP cladding layer, the MQW active layer, the first p-AlGaInP cladding layer, the second ESL layer, and the second p-AlGaInP cladding layer are selectively etched away until the second p-AlGaInP cladding layer of the first mesa-like lamination structure is exposed with the resist pattern used as an etching mask. As a result, the n-AlGaInP cladding layer, the MQW active layer, the first p-AlGaInP cladding layer, the second ESL layer, and the second p-AlGaInP cladding layer are left in the form of a second mesa-like lamination structure. The second mesa-like lamination structure thus formed forms a semiconductor laser for a DVD device.

Next, a resist pattern for formation of ridge waveguides is formed on the surfaces of the second p-AlGaInP cladding layers of the first and second mesa-like lamination structures. The dry etching is individually performed until the etching is stopped at each of the first and second ESL layers with the resist pattern used as an etching mask. Thus, ridge waveguides are formed in the first and second mesa-like lamination structures, respectively.

Alternatively, instead of forming the first and second ESL layers in the first and second mesa-like lamination structures, respectively, a resist pattern for formation of the ridge waveguides are formed on the surfaces of the second p-AlGaInP cladding layers of the first and second mesa-like lamination structures, respectively. Then, the dry etching is performed with the resist pattern used as an etching mask, and stopped in accordance with time control, thereby forming the ridge waveguides.

The controllability for the processing for the ridge waveguide exerts an influence on the size precision of the etching depth of the formed ridge waveguide. The size precision of the ridge waveguide exerts a large influence on an FFPx ("an FFP" is an abbreviation of "a Far Field Pattern") as a transverse spreading angle of a laser beam, and thus exerts a large influence on the emission characteristics of the laser element. Hence, this etching process is an important process. Consequently, during the processing of the ridge waveguide, the controllability for the etching is enhanced by providing an etching stopper layer in the epitaxial growth layer.

Examples of the monolithic two-wavelength LD having the etching stopper layer formed in the epitaxial growth layer are described as below. That is to say, there is known a two-wavelength laser device having a first laser diode and a second laser diode. In this case, the first laser diode having an emission wavelength of 780 nm includes a first p-type cladding layer made of $Al_{0.4}Ga_{0.6}As$, a p-type etching stop layer which is made of GaInP and which is laminated on the first p-type cladding layer, and a second p-type ridge-like cladding layer which is made of $Al_{0.4}Ga_{0.6}As$ and which is formed on the p-type etching stop layer. Also, the second laser diode having an emission wavelength of 650 nm includes a first p-type cladding layer made of $(Al_{0.7}Ga_{0.3})_{0.5}In_{0.5}P$, a p-type etching stop layer which is made of GaInP and which is laminated on the first p-type cladding layer, and a second p-type ridge-like cladding layer which is made of $(Al_{0.7}Ga_{0.3})_{0.5}In_{0.5}P$ and which is formed on the p-type etching stop layer. In addition, there is known a two-wavelength laser device in which each of the etching stop layers of the first and second laser diodes of the two-wavelength laser diode described above is made of AlGaAs. These two-wavelength laser diodes, for example, are disclosed in Japanese Patent Laid-open No. 2002-261397 (paragraphs [0043], [0045] and [0066], and FIGS. 1 and 7).

In addition, there is known a technique relating to mesa etching in forming a stripe (mesa portion) of a compound semiconductor layer including an active layer in manufacture of a semiconductor laser element. In the semiconductor laser element to which the technique described above relates, an etching end point detecting layer made of GaAlAs is formed on an n-GaAs substrate. Also, an isolation layer made of an n-type GaAs, an n-type cladding layer made of GaAlAs, an active layer made of GaAlAs, a p-type cladding layer made of GaAlAs, and a cap layer made of GaAs are successively formed on the etching end point detecting layer. Then, the dry etching is performed with a stripe-like insulating film formed on the cap layer used as an etching mask. Al which is exposed at a time point when the etching end point detecting layer is etched away is detected in the form of an emission spectrum, thereby stopping the dry etching. As a result, this method makes it possible to etch the mesa portion with higher precision in processing size than the time management is performed during the etching. This technique, for example, is disclosed in Japanese Patent Laid-open No. Shou 64-73726 (a top left column and a top right column of page 109).

A method of stopping etching when the etching for the ridge waveguide is performed is normally as below. That is to say, the ESL layer is provided in the epitaxial growth layer in order to stop the etching by using the chemical property of the wet etching liquid. Alternatively, the time control is performed through the dry etching.

However, when the time control is performed during the dry etching, the precision of the etching depth is insufficient.

In addition, the ESL layer used when the wet etching is performed is largely different in material constitution from the layer to be etched. For this reason, when the ESL layer is left in the semiconductor laser element, the electrical and optical characteristics of the semiconductor laser element may be impaired depending on the circumstances.

In particular, in the case of the monolithic two-wavelength LD, when the ESL layer is left in the LD for the DVD device, the oscillation efficiency is reduced due to the light absorption, which may become one of causes of impeding the high output promotion.

In addition, even in the case where the etching end detecting layer is provided in order to stop the dry etching during dry etching process, when the etching end detecting layer is left in the semiconductor laser element, the electrical and optical characteristics of the semiconductor laser elements may be impaired under certain circumstances. For this reason, it is necessary to adopt a structure such that even if left in the semiconductor laser element, the etching end detecting layer has no influence on the electrical and optical characteristics of the semiconductor laser diode as much as possible.

In addition, even if the etching end detecting layer is used, in particular, in the case of the monolithic two-wavelength LD, when the etching end point detecting layer is left in the LD for the DVD device, the oscillation efficiency is reduced due to the light absorption, which causes an impediment in the high output promotion.

SUMMARY OF THE INVENTION

The present invention has been made in order to solve the above-mentioned problems, and it is a first object of the present invention to construct a high-efficiency and high-output semiconductor laser device having excellent emission characteristics.

It is a second object of the present invention to provide a manufacturing method which is capable of manufacturing a high-efficiency and high-output semiconductor laser device having excellent emission characteristics through simple processes.

It is a third object of the present invention to provide a manufacturing method which is capable of manufacturing a high-efficiency and high-output monolithic multi-wavelength laser having excellent emission characteristics through simple processes.

According to one aspect of the invention, there is provided a semiconductor laser device according to the present invention comprises: a substrate of a first conductivity type; and a first semiconductor laser structure located on the substrate comprising, first first cladding layer of the first conductivity type formed on the substrate, first active layer located on the first first cladding layer, and including a quantum well layer, a first second cladding layer of a second conductivity type located on the first active layer, an etching end detecting layer of the second conductivity type located on the first second cladding layer, and having the same constituent elements as those of the first second cladding layer, and a first third cladding layer of the second conductivity type in a stripe mesa-like shape located on the etching end detecting layer, having the same constituent elements as those of the etching end detecting layer, and having composition ratios of two constituent elements in a complementary relation being different from those composition ratios of the etching end detecting layer.

Accordingly, in the semiconductor laser device according to the present invention, the etching depth of the first third cladding layer for which the etching is stopped by using the etching end detecting layer has the desired size precision, the laser beam has less dispersion of the transverse spreading angle, and the emission characteristics are excellent.

In addition, the etching end detecting layer has the same constituent elements as those of the first third cladding layer. Hence, the material constitution of the etching end detecting layer can be made close to that of the first third cladding layer. Moreover, the etching end detecting layer is made of the material in which the composition ratios of two constituent elements, of them, in a complementary relation are different from those of the first third cladding layer. Therefore, the precision of detecting the etching end can be enhanced, and the etching end detecting layer can be thinned. For this reason, even when the etching end detecting layer is left in the first semiconductor laser structure, it is possible to suppress the reduction of the oscillation efficiency due to the light absorption.

In its turn, it is possible to structure a high-efficiency and high-output semiconductor laser device having the excellent emission characteristics.

According to another aspect of the invention, there is provided a method of manufacturing the semiconductor laser diode according to the present invention includes: forming successively on a substrate of a first conductivity type, a first first cladding layer of the first conductivity type, a first active layer including a quantum well layer, a first second cladding layer of a second conductivity type, an etching end detecting layer of the second conductivity type having the same constituent elements as those of the first second cladding layer, and a first third cladding layer of the second conductivity type having the same constituent elements as those of the etching end detecting layer, and having composition ratios of two constituent elements in a complementary relation being different from those composition ratios of the etching end detecting layer; applying a resist on a surface of the first third cladding layer, forming a resist pattern having the stripe-like resist portion on a part of the surface of the first third cladding layer to be left as a first semiconductor laser lamination, etching with the resist pattern used as an etching mask until the substrate is exposed, and removing the resist pattern to form the first semiconductor laser lamination; and forming a resist pattern having a stripe-like resist portion corresponding to a ridge waveguide on a surface of the first semiconductor laser lamination, and etching the first semiconductor laser lamination with the resist pattern used as an etching mask to form the ridge waveguide until a difference is detected in intensity of an emission spectrum of a constituent element with which composition ratios in the first third cladding layer and the etching end detecting layer of the first semiconductor laser lamination are different from each other.

Accordingly, in the method of manufacturing the semiconductor laser diode according to the present invention, the etching end detecting layer is made of the material which has the same constituent elements as those of the material of the first third cladding layer, and in which the composition ratios of the two constituent elements, of them, in the complementary relation are different from those of the constituent elements of the first third cladding layer.

Hence, when the first third cladding layer is etched away in the stripe mesa-like shape, the etching for the first third cladding layer can be precisely stopped based on the detection of the constituent elements having the different composition ratios. Thus, it is possible to form the first third cladding layer which has the less dispersion in the etching depth. For this reason, it is possible to manufacture the semiconductor laser device having the excellent emission characteristics through the simple processes.

In addition, since the etching end position of the first third cladding layer can be precisely detected, the material constitution of the etching end detecting layer can be made close to that of the first third cladding layer, and the etching end detecting layer can also be thinned. For this reason, even when the etching end detecting layer is left in the first semiconductor laser structure, it is possible to suppress the reduction of the oscillation efficiency due to the light absorption.

In its turn, it is possible to readily manufacture a high-efficiency and high-output semiconductor laser diode having the excellent emission characteristics through the simple processes.

According to further another aspect of the invention, there is provided a method of manufacturing the semiconductor laser diode according to the present invention includes: forming successively on a substrate of a first conductivity type, a first first cladding layer of the first conductivity type, a first active layer including a quantum well layer, a first second cladding layer of a second conductivity type, an etching end detecting layer of the second conductivity type having the same constituent elements as those of the first second cladding layer, and a first third cladding layer of the second conductivity type having the same constituent elements as those of the etching end detecting layer, and having composition ratios of two constituent elements in a complementary relation being different from those composition ratios of the etching end detecting layer; applying a resist on a surface of the first third cladding layer, forming a resist pattern having the stripe-like resist portion on a part of the surface of the first third cladding layer to be left as a first semiconductor laser lamination, etching with the resist pattern used as an etching mask until the substrate is exposed, and removing the resist pattern to form the first semiconductor laser lamination; forming successively on the exposed substrate, a second first cladding layer of the first conductivity type, a second active layer including a quantum well layer, and a second second cladding layer of the second conductivity type having the same material constitution as that of the first third cladding layer; applying a resist on a surface of the second second cladding layer, forming a resist pattern having a resist portion on a part of the surface of the second second cladding layer to be left as a second semiconductor laser lamination adjacent to said first semiconductor laser lamination, etching with the resist pattern used as an etching mask to form the second semiconductor laser lamination until the first third cladding layer of the first laser lamination is exposed, and removing the resist pattern left on the surface of the second semiconductor laser lamination; and forming a resist pattern having the stripe-like resist portions corresponding to ridge waveguides to be formed on the surfaces of the first and second semiconductor laser laminations, and etching the first and second semiconductor laser laminations with the resist pattern used as an etching mask through the same process to form the respective ridge waveguides until a difference is detected in intensity of an emission spectrum of a constituent element with which composition ratios in the first third cladding layer and the etching end detecting layer of the first semiconductor laser lamination are different from each other.

Accordingly, in the method of manufacturing the semiconductor laser diode according to the present invention, the etching for the first third cladding layer of the first semiconductor laser lamination, and the etching for the second second cladding layer of the second semiconductor laser lamination can be performed through the same process. Also, the etching depths of the first third cladding layer and the second second cladding layer can be precisely controlled through such a simple process as to precisely stop the etching for the first third cladding layer and the etching for the second second cladding layer based on the etching end detecting layer of the first semiconductor laser lamination.

Therefore, the respective semiconductor laser structures emit the laser beams each having the desired transverse spreading angle, thereby showing the excellent emission characteristics. Also, the semiconductor laser structure includes no etching end detecting layer. As a result, it is possible to manufacture a high-efficiency and high-output monolithic multi-wavelength laser diode which has the high-efficiency and high-output as a whole, and which has the less dispersion in products, through a simple process.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

First Embodiment

Figure 1:
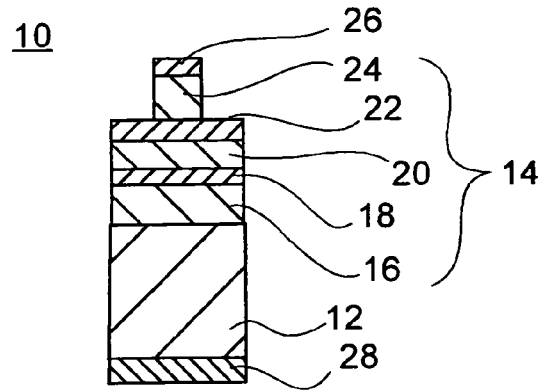
FIG. 1 is a cross-sectional view of a semiconductor laser according to one embodiment of the present invention.

FIG. 1 is a cross-sectional view of a semiconductor laser according to one embodiment of the present invention. In the following figures, the same reference numerals designate the same or corresponding constituent elements.

In FIG. 1, a semiconductor laser 10 is a ridge waveguide type LD having an emission wavelength of a 780 nm band. The semiconductor laser 10 is constituted by an n-GaAs substrate 12 used as a substrate of a first conductivity type, and a first LD structure 14 having an emission wavelength of a 780 nm band used as a first semiconductor structure.

The first LD structure 14 includes a first n-type cladding layer 16 used as a first first cladding layer, a first active layer 18 used as a first active layer, a first p-type cladding layer 20 used as a first second cladding layer, a signal layer 22 used as an etching end detecting layer, and a ridge waveguide 24 used as a stripe ridge-like first third cladding layer which are formed on the n-GaAs substrate 12 in this order. In this connection, the first n-type cladding layer 16 has a layer thickness of 3 μm for example and is made of n-$(Al_{0.5}Ga_{0.5})_{0.51}In_{0.49}P$. The first active layer 18 has a layer thickness of 50 nm, includes a quantum well layer which is made of $In_yGa_{1-y}As$, and is adjusted in emission wavelength to 780 nm. The first p-type cladding layer 20 is made of p-$(Al_{0.5}Ga_{0.5})_{0.51}In_{0.49}P$ for example. The signal layer 22 has a layer thickness of 30 nm and is made of p-$(Al_{0.3}Ga_{0.7})_{0.51}In_{0.49}P$, for example. Also, the ridge waveguide 24 has a layer thickness of 1.5 μm for example and is made of p-$(Al_{0.5}Ga_{0.5})_{0.51}In_{0.49}P$, for example.

The first p-type cladding layer 20, the signal layer 22 and the ridge waveguide 24 have the same material constitution, but composition ratios of elements (Al and Ga in this case) showing a mutually complementary relation differ from one another. In the first embodiment, for example, a constitution of the first p-type cladding layer 20 is expressed by p-$(Al_{x1}Ga_{1-x1})_{y1}In_{1-y1}P$. A constitution of the signal layer 22 is expressed by p-$(Al_{x2}Ga_{1-x2})_{y2}In_{1-y2}P$. Also, a constitution of the ridge waveguide 24 is expressed by p-$(Al_{x3}Ga_{1-x3})_{y3}In_{1-y3}P$. In the semiconductor laser 10, x1=x3 and y1=y3.

The composition ratios of Al and Ga of these material constitutions show the complementary relation. In the first embodiment, the composition ratio of Ga of the signal layer 22 is larger than that of Ga of the ridge waveguide 24. Thus, (1−x2)−(1−x3)>about 0.2 is established. As a result, x3−x2>about 0.2 is established. Thus, it is important for detection of the end point during the dry etching for the ridge waveguide 24 that the composition ratio of Al decreases as the composition ratio of Ga increases.

A p-electrode 26 and an n-electrode 28 are formed on a surface of the ridge waveguide 24 and a back surface of the n-GaAs substrate 12, respectively.

Next, a method of manufacturing the semiconductor laser 10 will be described.

Figure 2:
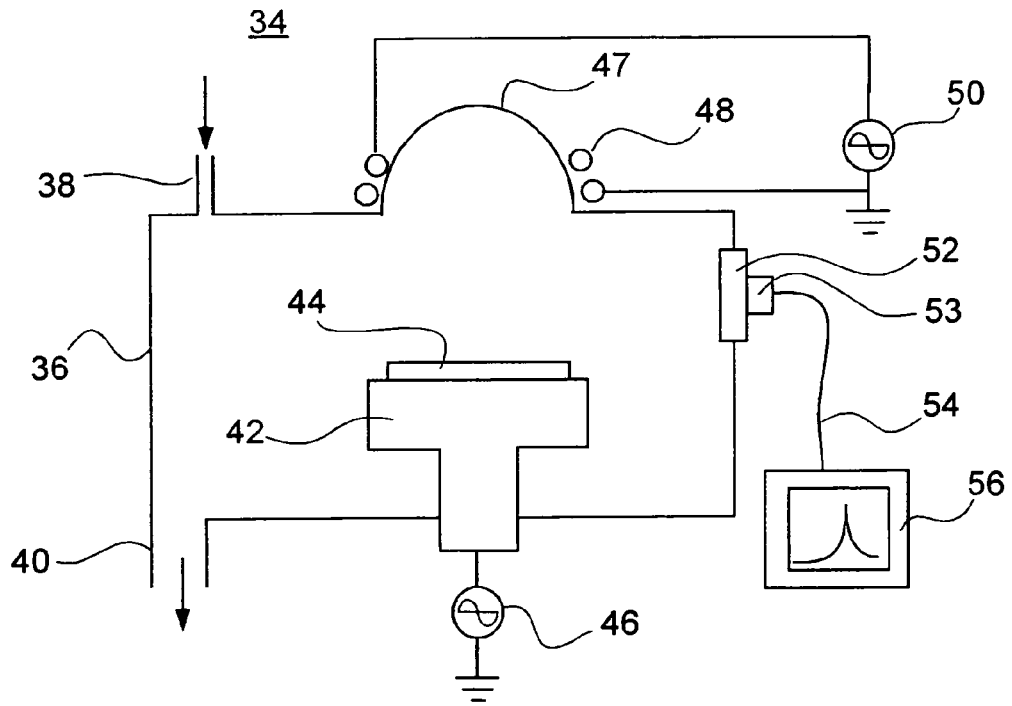
FIG. 2 is a schematic diagram of a dry etching system for the semiconductor laser according to the present invention.

FIG. 2 is a schematic diagram of a dry etching system for the semiconductor laser according to the present invention.

The dry etching method may adopt either an ECR system or an ICP system. In this case, the dry etching using the ICP system will now be described.

In FIG. 2, a reaction chamber 36 of a dry etching system 34 includes a supply port 38 for etching gas, and an exhaust port 40 for the etching gas. The etching gas is supplied into the reaction chamber 36 (an arrow in the supply port 38 indicates inflow of the etching gas) through the supply port 38. The etching gas after completion of the processing is exhausted to the outside through the exhaust port 40 by a vacuum exhauster (not shown) (an arrow in the exhaust port 40 indicates outflow of the etching gas).

A stage 42 is provided in a central portion of the reaction chamber 36, and a wafer 44 to be etched is placed on the stage 42. An FR power source 46 is connected between the stage 42 and a grounding end, and serves to apply a high-frequency voltage to the stage 42.

A bell jar 47 is provided above the stage 42. An inductor coupled plasma (ICP) coil 48 is wound round the belljar 47. The RF power source 50 is connected to the ICP coil 48. The RF power source 50 applies a high-frequency voltage to the ICP coil 48, thereby generating highly dense plasma inside the reaction chamber 36.

The reaction chamber 36 is also provided with an observation window 52. A light receiving portion 53 is installed in the observation window 52, and serves to detect light emission from the plasma during the dry etching. A plasma emission monitoring system 56 takes therein the light, from the plasma, which is detected by the light receiving portion 53 through an optical fiber 54. When the plasma emission monitoring system 56 detects an emission seed of the signal layer 22 which is previously set, the dry etching made by the dry etching system 34 is stopped in accordance with a signal from the plasma emission monitoring system 56.

Figure 3:
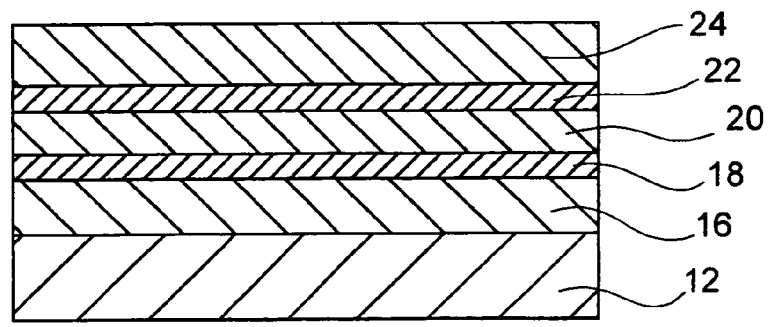
FIGS. 3, 4 and 5 are respectively cross-sectional views of the semiconductor laser in respective processes of the method of manufacturing the semiconductor laser according to one embodiment of the present invention.
Figure 4:
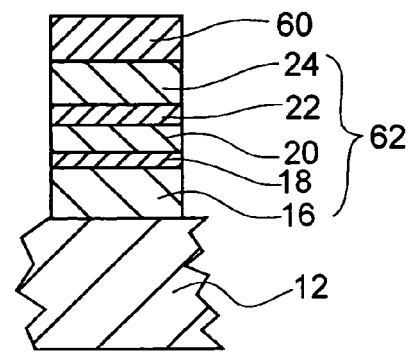
Figure 5:
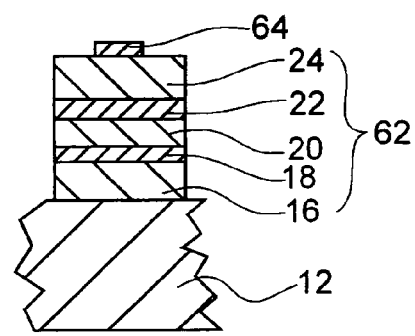

FIGS. 3, 4 and 5 are respectively cross-sectional views of the semiconductor laser in respective processes of the method of manufacturing the semiconductor laser according to one embodiment of the present invention.

As shown in FIG. 3, firstly, an n-$(Al_{0.5}Ga_{0.5})_{0.51}In_{0.49}P$ layer as the first n-type cladding layer 16, the first active layer 18 including a quantum well layer made of $In_yGa_{1-y}As$, a p-$(Al_{0.5}Ga_{0.5})_{0.51}In_{0.49}P$ layer as the first p-type cladding layer 20, a p-$(Al_{0.3}Ga_{0.7})_{0.51}In_{0.49}P$ layer as the signal layer 22, and a p-$(Al_{0.5}Ga_{0.5})_{0.51}In_{0.49}P$ layer for formation of the ridge waveguide 24 are successively laminated on the n-GaAs substrate 12 through the epitaxial growth by using the MOCVD method or MBE method.

Next, as shown in FIG. 4, a resist is applied to the surface of the p-$(Al_{0.5}Ga_{0.5})_{0.51}In_{0.49}P$ layer for formation of the ridge waveguide 24. Then, a resist pattern 60 having a stripe-like resist portion is formed in a portion, in which the first LD structure 14 is to be formed, of the surface of the p-$(Al_{0.5}Ga_{0.5})_{0.51}In_{0.49}P$ layer through the photolithography process. Next, the dry etching is performed until the n-GaAs substrate 12 is exposed with the resist pattern 60 used as an etching mask to form a first mesa-like lamination structure 62 used as a first semiconductor lamination. The first mesa-like structure 62 includes the n-$(Al_{0.5}Ga_{0.5})_{0.51}In_{0.49}P$ layer as the first n-type cladding layer 16, the first active layer 18 including the quantum well layer made of $In_yGa_{1-y}As$, the p-$(Al_{0.5}Ga_{0.5})_{0.51}In_{0.49}P$ layer as the first p-type cladding layer 20, the p-$(Al_{0.3}Ga_{0.7})_{0.51}In_{0.49}P$ layer as the signal layer 22, and the p-$(Al_{0.5}Ga_{0.5})_{0.51}In_{0.49}P$ layer for formation of the ridge waveguide 24.

Next, as shown in FIG. 5, the resist pattern 60 left on the surface of the first mesa-like lamination structure 62 is removed, and a resist is applied to the n-GaAs substrate 12 including the first mesa-like lamination structure 62 again. Next, a resist pattern 64, for formation of the ridge waveguide 24, having a stripe-like resist portion is formed on the surface of the p-$(Al_{0.5}Ga_{0.5})_{0.51}In_{0.49}P$ layer used as the uppermost layer of the first mesa-like lamination structure 62 through the photolithography process. Then, the etching is continuously performed until the etching of the signal layer 22 is clearly observed with the resist pattern 64 used as an etching mask. At a time point when the etching of the signal layer 22 is clearly observed, the etching is stopped. Thereafter, the resist pattern 64 is removed. As a result, the p-electrode 26 and the n-electrode 28 are formed on the surface of the ridge waveguide 24 and the back surface of the n-GaAs substrate 12, respectively. As a result, the semiconductor laser 10 is formed.

A ridge forming process for forming the ridge waveguide 24 will now be further described.

The p-$(Al_{0.5}Ga_{0.5})_{0.51}In_{0.49}P$ layer as the first p-type cladding layer 20, and the p-$(Al_{0.5}Ga_{0.5})_{0.51}In_{0.49}P$ layer for formation of the ridge waveguide 24 are made of the materials which have the same material composition and have the same composition ratios. The p-$(Al_{0.3}Ga_{0.7})_{0.51}In_{0.49}P$ layer as the signal layer 22 has the same material composition as that of each of the materials of which the first p-type cladding layer 20 and the ridge waveguide 24 are made, respectively. However, the p-$(Al_{0.3}Ga_{0.7})_{0.51}In_{0.49}P$ layer is different in composition ratios of Al and Ga as the two elements in a complementary relation from the first p-type cladding layer 20 and the ridge waveguide 24. That is to say, the material of which the signal layer 22 is made is larger in composition ratio of Ga than each of those of which the first p-type cladding layer 20 and the ridge waveguide 24 are made, respectively, and is smaller in composition ratio of Al than each of those of which the first p-type cladding layer 20 and the ridge waveguide 24 are made, respectively.

The resist pattern 64 is formed on the surface of the p-$(Al_{0.5}Ga_{0.5})_{0.51}In_{0.49}P$ layer for formation of the ridge waveguide 24 of the first mesa-like lamination structure 62 thus structured. Then, the dry etching is performed with the resist pattern 64 used as an etching mask by using the dry etching system 34 as shown in FIG. 3. As a result, the light receiving portion 53 detects the light emission from the plasma during the dry etching through the observation window 52. The plasma light emission monitoring system 56 takes therein the information on the light emission thus detected. When the intensity of the emission spectrum of Ga during the dry etching increases, it is possible to judge that the dry etching reaches the signal layer 22. Hence, the plasma light emission monitoring system 56 sends a signal for stop of the dry etching to the dry etching system 34.

The light emitting element and emission spectrum which are suitable for detecting the etching end out of the light emission from the plasma to be taken in are previously selected in the plasma light emission monitoring system 56. It becomes important for the selection of the light emitting element and emission spectrum that the specified emission spectrum does not overlap any of other emission spectra, and the emission intensity change can be obtained which is enough to precisely judge the desired etching end position.

Moreover, it is important that the signal layer 22 left between the ridge waveguide 24 and the first p-type cladding layer 20 does not cause the large reduction of the emission characteristics and electrical characteristics of the semiconductor laser 10.

In consideration of these conditions, in the semiconductor laser 10, the first p-type cladding layer 20 and the ridge waveguide 24 are made of the same material, and this material has the same material composition as that of the material of which the signal layer 22 is made. In spite of this, the composition ratios of Al and Ga as the two elements in a complementary relation are made slightly different from each other. Thus, the reduction in the emission characteristics and electrical characteristics is suppressed as much as possible.

During the etching for forming the ridge waveguide 24, the spectra of Ga, In and Al having strong intensities were observed in the wavelength of about 400 nm. As a result, in this case, the emission spectra from Ga are used for the specification. Of them, the emission spectrum of Ga having the wavelength of 417.2 nm is selected as the wavelength for the etching end detection.

In the case of the material of which the ridge waveguide 24 is made and the material of which the signal layer 22 is made, the material of which the ridge waveguide 24 is made has the composition ratio, 0.5, of Al, and the composition ratio, 0.5, of Ga, whereas the material of which the signal layer 22 is made has the composition ratio, 0.3, of Al, and the composition ratio, 0.7, of Ga. For this reason, the 417.2 nm-emission spectrum of Ga is observed with the plasma light emission monitoring system 56, and it is confirmed that the intensity of this emission spectrum becomes surely strong, thereby judging that the etching reaches the signal layer 22. As a result, the plasma light emission monitoring system 56 sends the etching stop signal to the dry etching system 34.

The following point is taken into consideration as a device for more sharply grasping a change in spectrum intensity between the the material of which the ridge waveguide 24 is made and the material of which the signal layer 22 is made.

That is to say, a decrease in spectrum intensity of Al following a decrease in composition ratio of Al from 0.5 to 0.3 is also taken into consideration without depending on only an increase in spectrum intensity of Ga due to an increase of the composition ratio of Ga from 0.5 to 0.7. Then, an Al spectrum intensity ratio as a ratio of the Al spectrum intensity of the material of which the signal layer 22 is made to the Al spectrum intensity of the material of which the ridge waveguide 24 is made is obtained. Similarly thereto, a Ga spectrum intensity ratio as a ratio of the Ga spectrum intensity of the material of which the signal layer 22 is made to the Ga spectrum intensity of the material of which the ridge waveguide 24 is made is obtained. Thus, the ratio of the Ga spectrum intensity ratio to the Al spectrum intensity ratio is obtained, thereby more sharply grasping a change in composition ratio of Ga.

The composition ratios of the predetermined elements are sharply grasped, whereby it is possible to further reduce a difference in composition ratio between Ga and Al in the material of which the ridge waveguide 24 is made and the material of which the signal layer 22 is made. Thus, it is possible to suppress the reduction in the emission characteristics and electrical characteristics of the semiconductor laser 10. In addition, the signal layer 22 can also be thinned.

At that, it is assumed that the film thickness of the etching end detecting layer is set to e.g. 10 nm. For the composition ratios of the two elements showing the mutually complementary relation in one material and the etching end detecting layer, if an increase in composition ratio of one element by about 0.2 and a decrease in composition ratio of the other element by about 0.2 are obtained between the one material and the material of the etching end detecting layer, the progress of the etching from the one material to the etching end detecting layer can be identified during the etching by detecting the emission spectrum as described above.

Consequently, in the semiconductor laser 10 of the first embodiment, the first p-type cladding layer 20 and the ridge waveguide 24 are made of the same material. In addition, the composition ratio of Al as one of the two elements in the complementary relation is made smaller and the composition ratio of Ga as the other element is made larger in the material of the signal layer 22 having the same material component in comparison with that material. For this reason, when etching is performed for the ridge waveguide, the size precision of the etching depth is enhanced, the horizontal spreading angle of the laser beam is adjusted to the desired value, and the dispersion is less.

In addition thereto, the material constitution of the material of which the signal layer 22 is made can be made close to that of each of the materials of which the first p-type cladding layer 20 and the ridge waveguide 24 are made, respectively, and the signal layer can also be thinned. Hence, even when the signal layer 22 is left in the semiconductor laser 10, the reduction of the emission efficiency due to the light absorption can be suppressed as much as possible. In its turn, it is possible to structure the semiconductor laser having the excellent electrical and optical characteristics.

In addition, in the semiconductor laser 10, the first p-type cladding layer 20 and the ridge waveguide 24 are made of the same material, and the composition ratio of Al as one of the two elements showing the complementary relation is made small and the composition ratio of Ga as the other element is made large in the material of the signal layer 22 having the same material composition as that of that material. Hence, while the dry etching is performed for the ridge waveguide 24, a change in intensity of the emission spectrum of Ga can be precisely grasped, and thus the stop of the etching can be accurately performed. For this reason, including the simple processes described above results in that the etching depth of the ridge waveguide 24 is precisely controlled, the size precision of the ridge waveguide 24 is enhanced, and the dispersion in the transverse spreading angle of the laser beam becomes less. In its turn, it is possible to manufacture the semiconductor laser which is excellent in the electrical and optical characteristics and which is less in the dispersion in these characteristics through the simple processes.

As described above, the semiconductor laser diode of the present invention comprises: a substrate of a first conductivity type; and a first semiconductor laser structure located on the substrate comprising, a first first cladding layer of the first conductivity type formed on said substrate, a first active layer located on the first first cladding layer, and including a quantum well layer, a first second cladding layer of a second conductivity type located on the first active layer, an etching end detecting layer of the second conductivity type located on the first second cladding layer, and having the same constituent elements as those of the first second cladding layer, and a first third cladding layer of the second conductivity type in a stripe mesa-like shape located on the etching end detecting layer, having the same constituent elements as those of the etching end detecting layer, and having composition ratios of two constituent elements in a complementary relation being different from those composition ratios of the etching end detecting layer.

With this structure, in the semiconductor laser device according to the present invention, the etching depth of the first third cladding layer for which the etching is stopped by using the etching end detecting layer has the desired size precision, the laser beam has less dispersion of the transverse spreading angle, and the emission characteristics are excellent. In addition, the etching end detecting layer has the same constituent elements as those of the first third cladding layer. Hence, the material constitution of the etching end detecting layer can be made close to that of the first third cladding layer. Also, the etching end detecting layer is made of the material in which the composition ratios of two constituent elements, of them, in a complementary relation are different from those of the first third cladding layer.

Hence, the precision of detecting the etching end can be enhanced, and the etching end detecting layer can be thinned. For this reason, even when the etching end detecting layer is left in the first semiconductor laser structure, it is possible to suppress the reduction of the oscillation efficiency due to the light absorption. In its turn, it is possible to structure the high-efficiency and high-output semiconductor laser device having the excellent emission characteristics.

In addition, A method of manufacturing the semiconductor laser diode according to the present invention includes: forming successively on a substrate of a first conductivity type, a first first cladding layer of the first conductivity type, a first active layer including a quantum well layer, a first second cladding layer of a second conductivity type, an etching end detecting layer of the second conductivity type having the same constituent elements as those of the first second cladding layer, and a first third cladding layer of the second conductivity type having the same constituent elements as those of the etching end detecting layer, and having composition ratios of two constituent elements in a complementary relation being different from those composition ratios of the etching end detecting layer; applying a resist on a surface of the first third cladding layer, forming a resist pattern having the stripe-like resist portion on a part of the surface of the first third cladding layer to be left as a first semiconductor laser lamination, etching with the resist pattern used as an etching mask until the substrate is exposed, and removing the resist pattern to form the first semiconductor laser lamination; and forming a resist pattern having a stripe-like resist portion corresponding to a ridge waveguide on a surface of the first semiconductor laser lamination, and etching the first semiconductor laser lamination with the resist pattern used as an etching mask to form the ridge waveguide until a difference is detected in intensity of an emission spectrum of a constituent element with which composition ratios in the first third cladding layer and the etching end detecting layer of the first semiconductor laser lamination are different from each other.

In the method of manufacturing the semiconductor laser diode, the etching end detecting layer is made of the material which has the same constituent elements as those of the material of the first third cladding layer, and in which the composition ratios of the two constituent elements, of them, in the complementary relation are different from those of the constituent elements of the first third cladding layer.

Hence, when the first third cladding layer is etched away in the stripe mesa-like shape, the etching for the first third cladding layer can be precisely stopped based on the detection of the constituent elements having the different composition ratios. Thus, it is possible to form the first third cladding layer which has the less dispersion in the etching depth. For this reason, it is possible to manufacture the semiconductor laser device having the excellent emission characteristics through the simple processes. In addition, since the etching end position of the first third cladding layer can be precisely detected, the material constitution of the etching end detecting layer can be made close to that of the first third cladding layer, and the etching end detecting layer can also be thinned. For this reason, even when the etching end detecting layer is left in the first semiconductor laser structure, it is possible to suppress the reduction of the oscillation efficiency due to the light absorption. In its turn, it is possible to readily manufacture the high-efficiency and high-output semiconductor laser diode having the excellent emission characteristics through the simple processes.

Second Embodiment

Figure 6:
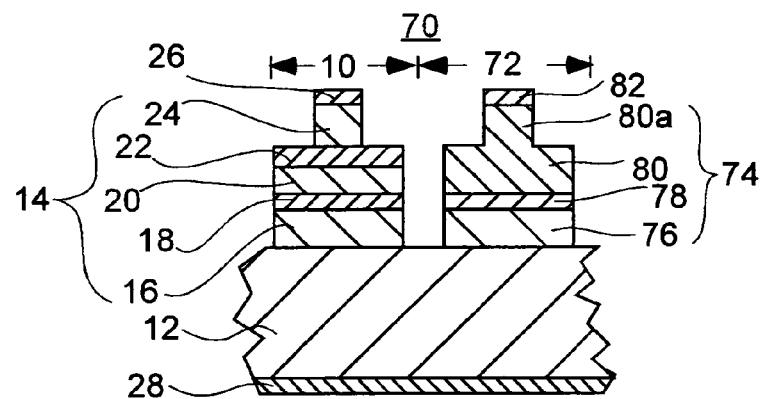
FIG. 6 is a cross-sectional view of a semiconductor laser according to one embodiment of the present invention.

FIG. 6 is a cross-sectional view of a semiconductor laser according to one embodiment of the present invention.

Also, FIG. 6 shows a monolithic multi-wavelength laser. In the second embodiment, a description is given of a monolithic two-wavelength LD by way example.

A monolithic two-wavelength LD 70 is formed as below. That is to say, the semiconductor laser 10 as the ridge waveguide type LD having the emission wavelength of a 780 nm band for the CD device described in the first embodiment, and a semiconductor laser 72 as a ridge waveguide type LD having the emission wavelength of about 650 nm for the DVD device are monolithically formed on the same n-GaAs substrate 12.

In the monolithic two-wavelength LD 70, as previously described in the first embodiment, a portion of the semiconductor laser 10 is obtained by forming the first LD structure 14 on the n-GaAs substrate 12.

A portion of the semiconductor laser 72 is obtained as below. That is to say, a second LD structure 74 having an emission wavelength of a 650 nm band used as a second semiconductor structure is formed on the same n-GaAs substrate 12 adjacent to the first LD structure 14 formed on the n-GaAs substrate 12 independently of the first LD structure 14.

The second LD structure 74 includes a second n-type cladding layer 76 used as a second first cladding layer, a second active layer 78 used as a second active layer, and a second p-type cladding layer 80 used as a second second cladding layer which are successively formed on the n-GaAs substrate 12. In this connection, for example, the second n-type cladding layer 76 has a layer thickness of 3 μm and is made of n-$(Al_{0.7}Ga_{0.3})_{0.51}In_{0.49}P$. The second active layer 78 has a layer thickness of 50 nm and includes a quantum well layer which is made of $(Al_wGa_{1-w})_uIn_{1-u}P$ and which is adjusted in emission wavelength to 650 nm. Also, the second p-type cladding layer 80 has a layer thickness of 1.5 μm and is made of p-$(Al_{0.7}Ga_{0.3})_{0.51}In_{0.49}P$. Then, part of the second p-type cladding layer 80 projects therefrom in a mesa stripe-like shape to form a ridge waveguide 80a.

A p-electrode 82 is formed on a surface of the ridge waveguide 80a.

Next, a method of manufacturing the semiconductor laser 70 will be described.

FIGS. 7, 8, 9 and 10 are respectively cross sectional views of the semiconductor laser in processes of a method of manufacturing the semiconductor laser according to one embodiment of the present invention.

Firstly, as shown in FIG. 3 of the first embodiment, the n-$(Al_{0.5}Ga_{0.5})_{0.51}In_{0.49}P$ layer as the first n-type cladding layer, the first active layer 18 including the quantum well layer made of $In_vGa_{1-v}As$, the p-$(Al_{0.5}Ga_{0.5})_{0.51}In_{0.49}P$ layer as the first p-type cladding layer 20, the p-$(Al_{0.3}Ga_{0.7})_{0.51}In_{0.49}P$ layer as the signal layer 22, and the p-$(Al_{0.5}Ga_{0.5})_{0.51}In_{0.49}P$ layer for formation of the ridge waveguide 24 are successively laminated on the n-GaAs substrate 12 through the epitaxial growth by using the MOCVD method or the MBE method.

Figure 7:
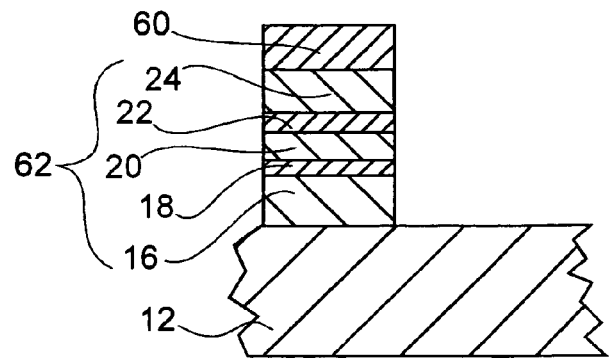
FIGS. 7, 8, 9 and 10 are respectively cross sectional views of the semiconductor laser in processes of a method of manufacturing the semiconductor laser according to one embodiment of the present invention.

Next, as shown in FIG. 7, in order to form the first mesa-like lamination structure 62 of the semiconductor laser 10, a resist is applied to a surface of the p-$(Al_{0.5}Ga_{0.5})_{0.51}In_{0.49}P$ layer. Then, a resist pattern 60 having the stripe-like resist portion is formed on a portion, in which the first LD substrate 14 is to be formed, on the surface of the p-$(Al_{0.5}Ga_{0.5})_{0.51}In_{0.49}P$ layer through the photolithography process. Next, the dry etching is continuously performed until the n-GaAs substrate 12 is exposed with the resist pattern 60 used as an etching mask, thereby forming the first mesa-like lamination structure 62.

Figure 8:
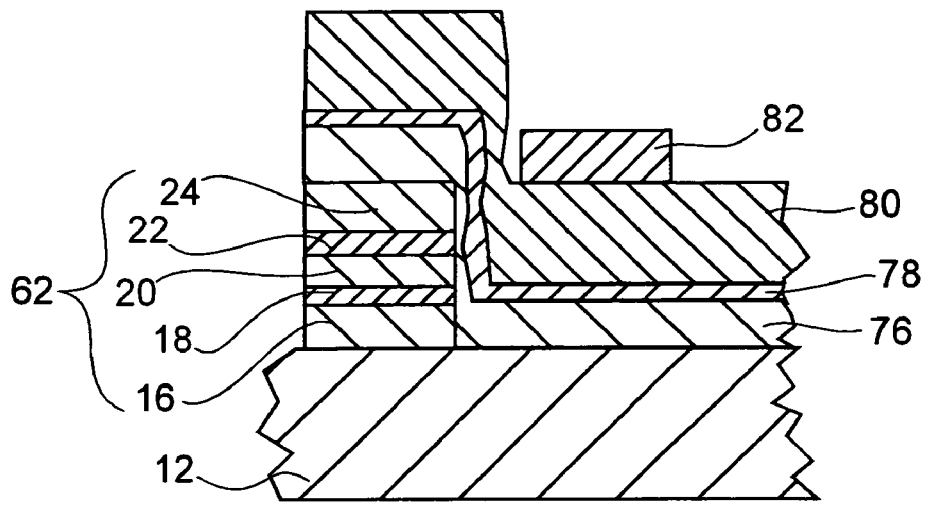

Next, as shown in FIG. 8, the resist pattern 60 left on the surface of the first mesa-like lamination structure 62 is removed, and individual layers constituting the second LD structure 74 are laminated.

That is to say, an n-$(Al_{0.7}Ga_{0.3})_{0.51}In_{0.49}P$ layer as the second n-type cladding layer 76, a second active layer 78 including a quantum well layer made of $(Al_wGa_{1-w})_uIn_{1-u}P$, and a p-$(Al_{0.7}Ga_{0.3})_{0.51}In_{0.49}P$ layer as a second p-type cladding layer 80 are successively laminated on the n-GaAs substrate 12m including the first mesa-like lamination substrate 62 through the epitaxial growth. This epitaxial growth is performed by using the MOCVD method or the MBE method.

Thereafter, a resist is applied to the surface of the p-$(Al_{0.7}Ga_{0.3})_{0.51}In_{0.49}P$ layer as the second p-type cladding layer 80. Then, a resist portion 82 having a stripe-like resist portion is formed on a portion, in which the second LD structure 74 is to be formed, next to the first mesa-like lamination structure 62 through the photolithography process.

Figure 9:
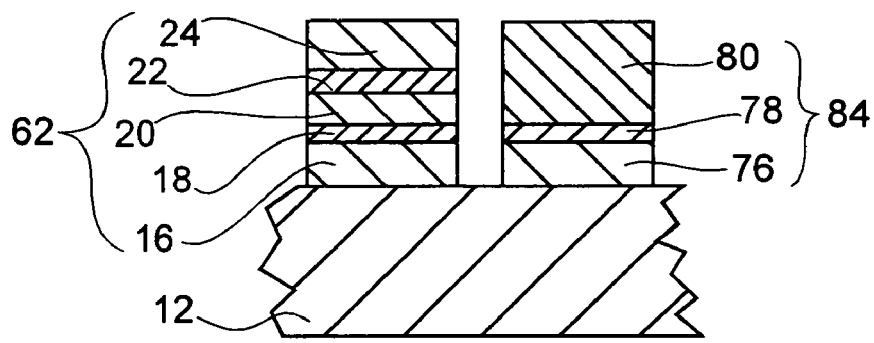

Next, as shown in FIG. 9, the dry etching is continuously performed until the p-$(Al_{0.5}Ga_{0.5})_{0.51}In_{0.49}P$ layer for formation of the ridge waveguide 24 of the first mesa-like lamination structure 62 is exposed with the resist pattern 82 used as an etching mask. As a result, a second mesa-like lamination structure 84 used as a second semiconductor lamination is formed. Then, the resist pattern 82 left on the surface of the second mesa-like lamination structure 84 is removed.

Figure 10:
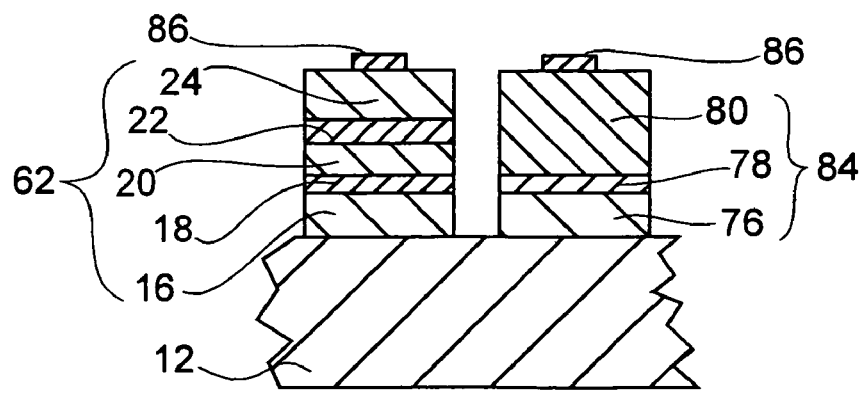

Next, as shown in FIG. 10, a resist is applied to the n-GaAs substrate 12 including the first mesa-like lamination substrate 62 and the second mesa-like lamination structure 84 again. Next, a resist pattern 86 is formed through the photolithography process. In this connection, a stripe-like resist portion for formation of the ridge waveguide 24 on the surface of the p-$(Al_{0.5}Ga_{0.5})_{0.51}In_{0.49}P$ layer used as the uppermost layer of the first mesa-like lamination substrate 62, and a stripe-like resist portion for formation of the ridge waveguide 80a on the surface of the second p-type cladding layer 80 of the second mesa-like lamination structure 84 are left in the resist pattern 86.

Next, the ridge waveguide 24 and the ridge waveguide 80a are formed by using the dry etching method in the same process with the resist pattern 86 used as an etching mask. The dry etching is continuously performed until it is clearly observed that the signal layer 22 of the first mesa-like lamination structure 62 is etched. At a time point when the etching of the signal layer 22 of the first mesa-like lamination structure 62 is clearly observed, the dry etching is stopped. That is to say, the dry etching for forming the ridge waveguide 80a is also stopped with the clear observation of the etching of the signal layer 22 as a criterion. Thereafter, the resist pattern 86 is removed, so that the p-electrode 26 and the p-electrode 82 are formed on the surface of the ridge waveguide 24 and the surface of the ridge waveguide 80a, respectively. Also, the n-electrode 28 is formed on the back surface of the n-GaAs substrate 12. Thus, the semiconductor 70 is formed.

The method of stopping the dry etching with the clear observation of the etching of the signal layer 22 as a criterion is the same as that described in the first embodiment.

In the second embodiment, the monolithic two-wavelength LD has been described so far. However, more semiconductor laser structures are formed on the same substrate, whereby it is possible to structure the monolithic multi-wavelength LD which can emit more laser beams having respective emission wavelengths.

The monolithic two-wavelength LD 70 in the second embodiment includes the first LD structure 14 corresponding to the semiconductor laser 10 as the ridge waveguide type LD having the emission wavelength of a 780 nm band, and the second LD structure 74 corresponding to the semiconductor laser 72 as the ridge waveguide type LD having the emission wavelength of about 650 nm. Also, the first LD structure includes the signal layer 22 for formation of the ridge waveguide 24 of the first LD structure 14. However, the second LD structure 74 includes neither of the ESL layer for formation of the ridge waveguide 80a in the part of the second p-type cladding layer 80 of the second LD structure 74, and the etching end detecting layer.

However, the ridge waveguide 80a has the same material constitution as that of the ridge waveguide 24 of the first LD structure 14. Thus, the ridge waveguide 80a and the ridge waveguide 24 are formed by using the dry etching in the same process. The dry etching is precisely stopped based on the clear observation of the etching of the signal layer 22 of the first LD structure 14. For this reason, the etching depth of the ridge waveguide 80a is precisely controlled, and the ridge waveguide 80a is precisely formed so as to have the desired size.

Normally, in the monolithic two-wavelength LD, the high efficiency promotion on the short wavelength side is difficult to attain in terms of the technique, and the high output cannot be ensured in many cases. On the other hand, the high-efficiency promotion on the long wavelength side is relatively easy to attain. In the monolithic two-wavelength LD 70, the second LD structure 74 on the short wavelength side includes neither of the ESL layer and the etching end detecting layer. Hence, since no light is absorbed by the ESL layer and the etching end detecting layer, the reduction of the oscillation efficiency is suppressed in the second LD structure 74 on the short wavelength side.

For this reason, the monolithic two-wavelength LD 70 can be structured as the high-efficiency and high-output monolithic two-wavelength LD as a whole.

In addition, the etching for both the ridge waveguide 24 and the ridge waveguide 80a is precisely stopped based on the signal layer 22 of the first LD structure 14. Hence, it is possible to provide the monolithic two-wavelength LD which has the high size precision in the ridge waveguide 24 and the ridge waveguide 80a, which has the excellent emission characteristics because it emits the laser beams each having the desired transverse spreading angle, and which has the less dispersion in products.

In addition, the processes for forming both the ridge waveguide 24 and the ridge waveguide 80a includes such a simple process as to stop the etching based on the signal layer 22 of the first LD structure 14. As a result, it is possible to manufacture the high-efficiency and high-output monolithic two-wavelength LD which has the excellent emission characteristics because it emits the laser beams each having the desired transverse spreading angle and which has the less dispersion in products.

As described above, the semiconductor laser device according to the second embodiment comprises: a substrate of a first conductivity type; a first semiconductor laser structure located on the substrate comprising, a first first cladding layer of the first conductivity type formed on said substrate, a first active layer located on the first first cladding layer, and including a quantum well layer, a first second cladding layer of a second conductivity type located on the first active layer, an etching end detecting layer of the second conductivity type located on the first second cladding layer, and having the same constituent elements as those of the first second cladding layer, and a first third cladding layer of the second conductivity type located on the etching end detecting layer in a stripe mesa-like shape, having the same constituent elements as those of the etching end detecting layer, and having composition ratios of two constituent elements in a complementary relation being different from those composition ratios of the etching end detecting layer; and a second semiconductor laser structure located on the substrate independently of the first semiconductor laser structure, the second semiconductor laser structure comprising, a second first cladding layer of the first conductivity type located on said substrate, a second active layer located on the second first cladding layer, and including a quantum well layer, and a second second cladding layer of the second conductivity type located on the second active layer, having the same material constitution as that of said first third cladding layer, and having a part projected in a stripe mesa-like shape.

With this structure, the semiconductor laser device includes the first semiconductor laser structure having the stripe mesa-like first third cladding layer which is precisely formed, and the second semiconductor laser structure having no etching end detecting layer, but having the second second cladding layer with the part of which projects in the precise stripe mesa-like shape.

Hence, the respective semiconductor laser structures emit the laser beams each having the desired transverse spreading angle, thereby showing the excellent emission characteristics. Also, the second semiconductor laser structure includes no etching end detecting layer. As a result, it is possible to structure the monolithic multi-wavelength semiconductor laser device which has the high-efficiency and high-output as a whole, and which has the less dispersion in products.

In addition, the method of manufacturing the semiconductor laser device according to the second embodiment includes: forming successively on a substrate of a first conductivity type, a first first cladding layer of the first conductivity type, a first active layer including a quantum well layer, a first second cladding layer of a second conductivity type, an etching end detecting layer of the second conductivity type having the same constituent elements as those of the first second cladding layer, and a first third cladding layer of the second conductivity type having the same constituent elements as those of the etching end detecting layer, and having composition ratios of two constituent elements in a complementary relation being different from those composition ratios of the etching end detecting layer; applying a resist on a surface of the first third cladding layer, forming a resist pattern having the stripe-like resist portion on a part of the surface of the first third cladding layer to be left as a first semiconductor laser lamination, etching with the resist pattern used as an etching mask until said substrate is exposed, and removing the resist pattern to form the first semiconductor laser lamination; forming successively on the exposed substrate, a second first cladding layer of the first conductivity type, a second active layer including a quantum well layer, and a second second cladding layer of the second conductivity type having the same material constitution as that of the first third cladding layer; applying a resist on a surface of the second second cladding layer, forming a resist pattern having a resist portion on a part of the surface of the second second cladding layer to be left as a second semiconductor laser lamination adjacent to said first semiconductor laser lamination, etching with the resist pattern used as an etching mask to form the second semiconductor laser lamination until the first third cladding layer of the first laser lamination is exposed, and removing the resist pattern left on the surface of said second semiconductor laser lamination; and forming a resist pattern having the stripe-like resist portions corresponding to ridge waveguides to be formed on the surfaces of the first and second semiconductor laser laminations, and etching the first and second semiconductor laser laminations with the resist pattern used as an etching mask through the same process to form the respective ridge waveguides until a difference is detected in intensity of an emission spectrum of a constituent element with which composition ratios in the first third cladding layer and the etching end detecting layer of the first semiconductor laser lamination are different from each other.

Hence, the etching for the first third cladding layer of the first semiconductor laser lamination, and the etching for the second second cladding layer of the second semiconductor laser lamination can be performed through the same process. Also, the etching depths of the first third cladding layer and the second second cladding layer can be precisely controlled through such a simple process as to precisely stop the etching for the first third cladding layer and the etching for the second second cladding layer based on the etching end detecting layer of the first semiconductor laser lamination. As a result, the respective semiconductor laser structures emit the laser beams each having the desired transverse spreading angle, thereby showing the excellent emission characteristics. Also, the semiconductor laser structure includes no etching end detecting layer. As a result, it is possible to manufacture the monolithic multi-wavelength semiconductor laser diode which has the high-efficiency and high-output as a whole, and which has the less dispersion in products, through a simple process as above.

It should be noted that while in the second embodiment, the description has been given of the example in which the signal layer is provided in the long-wavelength side semiconductor laser, the present invention is not limited thereto. That is to say, the signal layer may also be provided in the short- wavelength side semiconductor laser.

As set forth hereinabove, the semiconductor laser device according to the present invention is suitable for semiconductor laser devices for use in the information electronic apparatuses.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device comprising:
    a substrate of a first conductivity type;
    a first semiconductor laser structure located on said substrate and comprising
        a first first cladding layer of the first conductivity type on said substrate,
        a first active layer located on the first first cladding layer, and including a quantum well layer,
        a first second cladding layer of a second conductivity type located on the first active layer,
        an etching end detecting layer of the second conductivity type located on the first second cladding layer, and having the same constituent elements as those of the first second cladding layer, and
        a first third cladding layer of the second conductivity type, having a stripe mesa-like shape, located on the etching end detecting layer, having the same constituent elements as those of the etching end detecting layer, and having composition ratios of two constituent elements in a complementary relation, different from those composition ratios of the etching end detecting layer; and
    a second semiconductor laser structure located on said substrate independently of said first semiconductor laser structure, the second semiconductor laser structure comprising
        a second first cladding layer of the first conductivity type located on said substrate,
        a second active layer located on the second first cladding layer, and including a quantum well layer, and
        a second second cladding layer of the second conductivity type located on the second active layer, having the same material constitution as that of said first third cladding layer, and having a part projecting in a stripe mesa-like shape.

2. The semiconductor laser device according to claim 1, wherein said first third cladding layer is $(Al_{x1}Ga_{1-x1})_{y1}In_{1-y1}P$, and said etching end detecting layer is $(Al_{x2}Ga_{1-x2})_{y2}In_{1-y2}P$ having a larger Ga composition ratio than that of said first third cladding layer.

3. The semiconductor laser diode according to claim 2, wherein said first active layer includes a quantum well layer of $In_yGa_{1-y}As$.

4. A method of manufacturing a semiconductor laser device including:
    forming successively on a substrate of a first conductivity type, a first first cladding layer of the first conductivity type, a first active layer including a quantum well layer, a first second cladding layer of a second conductivity type, an etching end detecting layer of the second conductivity type and having the same constituent elements as those of the first second cladding layer, and a first third cladding layer of the second conductivity type, having the same constituent elements as those of the etching end detecting layer and having composition ratios of two constituent elements in a complementary relation that are different from those composition ratios of the etching end detecting layer;
    applying a resist on a surface of the first third cladding layer, forming a first resist pattern having a stripe-like resist portion on a part of the surface of said first third cladding layer to be left as a first semiconductor laser lamination, etching, using the first resist pattern as an etching mask until said substrate is exposed, and removing the first resist pattern to form said first semiconductor laser lamination; and forming a second resist pattern having a stripe-like resist portion corresponding to a ridge waveguide on a surface of said first semiconductor laser lamination, and etching said first semiconductor laser lamination, using the second resist pattern as an etching mask to form the ridge waveguide until a difference is detected in intensity of an emission spectrum of a constituent element with which composition ratios in the first third cladding layer and the etching end detecting layer of said first semiconductor laser lamination are different from each other.

5. A method of manufacturing a semiconductor laser device including:

forming successively on a substrate of a first conductivity type, a first first cladding layer of the first conductivity type, a first active layer including a quantum well layer, a first second cladding layer of a second conductivity type, an etching end detecting layer of the second conductivity type and having the same constituent elements as those of the first second cladding layer, and a first third cladding layer of the second conductivity type, having the same constituent elements as those of the etching end detecting layer, and having composition ratios of two constituent elements in a complementary relation that are different from those composition ratios of the etching end detecting layer;

applying a resist on a surface of the first third cladding layer, forming a first resist pattern having a stripe-like resist portion on a part of the surface of said first third cladding layer to be left as a first semiconductor laser lamination, etching, using the first resist pattern as an etching mask until said substrate is exposed, and removing the resist pattern to form said first semiconductor laser lamination;

forming successively on said exposed substrate, a second first cladding layer of the first conductivity type, a second active layer including a quantum well layer, and a second second cladding layer of the second conductivity type having the same material constitution as that of the first third cladding layer;

applying a resist on a surface of the second second cladding layer, forming a second resist pattern having a resist portion on a part of the surface of the second second cladding layer to be left as a second semiconductor laser lamination adjacent to said first semiconductor laser lamination, etching, using the second resist pattern as an etching mask to form said second semiconductor laser lamination until the first third cladding layer of said first laser lamination is exposed, and removing the second resist pattern left on the surface of said second semiconductor laser lamination; and forming a third resist pattern having stripe-like resist portions corresponding to ridge waveguides to be formed on the surfaces of said first and second semiconductor laser laminations, and etching said first and second semiconductor laser laminations, using the third resist pattern as an etching mask to form the respective ridge waveguides until a difference is detected in intensity of an emission spectrum of a constituent element with which composition ratios in the first third cladding layer and the etching end detecting layer of said first semiconductor laser lamination are different from each other.

6. The method of manufacturing a semiconductor laser diode according to claim 4, wherein said first third cladding layer is $(Al_{x1}Ga_{1-x1})_{y1}In_{1-y1}P$, and said etching end detecting layer is $(Al_2Ga_{1-x2})_{y2}In_{1-y2}P$ and has a larger Ga composition ratio than that of said first third cladding layer.

7. A method of manufacturing a semiconductor laser diode according to claim 6, wherein said first active layer includes a quantum well layer of $In_vGa_{1-v}As$.

* * * * *